(12) United States Patent
Asahi et al.

(10) Patent No.: US 6,334,897 B1
(45) Date of Patent: Jan. 1, 2002

(54) METHOD OF MANUFACTURING COMPOUND SEMICONDUCTOR SINGLE CRYSTAL

(75) Inventors: Toshiaki Asahi; Keiji Kainosho; Tatsuya Nozaki; Kenji Sato, all of Toda (JP)

(73) Assignee: Japan Energy Corporation, Tokyo (JP)

(*) Notice: Subject to any disclaimer, the term of this patent is extended or adjusted under 35 U.S.C. 154(b) by 0 days.

(21) Appl. No.: 09/424,794

(22) PCT Filed: Mar. 29, 1999

(86) PCT No.: PCT/JP99/01581

§ 371 Date: Nov. 30, 1999

§ 102(e) Date: Nov. 30, 1999

(87) PCT Pub. No.: WO99/50481

PCT Pub. Date: Oct. 7, 1999

(30) Foreign Application Priority Data

Mar. 31, 1998 (JP) .................................... 10-101859
Apr. 24, 1998 (JP) .................................... 10-114432
May 21, 1998 (JP) .................................... 10-155416

(51) Int. Cl.⁷ .................................................. C30B 13/14
(52) U.S. Cl. .................................................. 117/81; 117/83
(58) Field of Search ........................ 117/81; 11/83

(56) References Cited

U.S. PATENT DOCUMENTS 5,123,996 A * 6/1992 Shahid et al. .................. 117/81
5,342,475 A     8/1994 Yoshida et al.

FOREIGN PATENT DOCUMENTS

| JP | 5-124887 A | 5/1993 |
| JP | 6-345581 A | 12/1994 |
| JP | 7-277869   | 10/1995 |
| JP | 1087392    | 4/1998 |

OTHER PUBLICATIONS

Influence of the crucible shape on the formation of facets and twins in the growth of GaAs by the vertical gradient freeze technique; Amon, et al; J. Crystal. Growth (1998) 187(1), 1–8.*
Semiconductor investigation, vol. 35, table of contents; pp. 11–23 (1991).

* cited by examiner

Primary Examiner—Felisa Hiteshew
(74) Attorney, Agent, or Firm—Birch, Stewart, Kolasch & Birch, LLP

(57) ABSTRACT

A method for producing a compound semiconductor single crystal, comprises the steps of: using a crucible having a bottom, a cylindrical shape, a diameter increasing portion having a reversed conical shape in a lower end side of the crucible, and a set portion for a seed crystal in a center of the bottom of the diameter increasing portion; setting a seed crystal in the seed crystal set portion of the crucible; putting a raw material of the compound semiconductor and an encapsulating material into the crucible; enclosing the crucible in an inner container; thereafter setting the inner container in a vertical type furnace; heating the raw material and the encapsulating material by a heating means to melt; and solidifying the obtained raw material melt from the seed crystal toward an upper side with annealing the raw material melt from a lower side to grow a single crystal of the compound semiconductor; wherein a rate of crystal growth at the diameter increasing portion of the crucible is made not less than 20 mm/hr during the crystal is grown.

11 Claims, 9 Drawing Sheets

METHOD OF MANUFACTURING COMPOUND SEMICONDUCTOR SINGLE CRYSTAL

This application is the national phase under 35 U.S.C. §371 of PCT International Application No. PCT/JP99/01581 which has an international filing date of Mar. 29, 1999, which designated the United States of America.

TECHNICAL FIELD

The present invention relates to a method for producing a compound semiconductor single crystal, for example, to a useful technique applied to a vertical gradient freeze method (VGF) or vertical Bridgman (VB) method for growing a single crystal in a vertical direction by cooling raw material melt of a compound semiconductor, such as InP.

BACKGROUND ART

Previously, for producing industrially a compound semiconductor single crystal ingot of group III-V, such as GaAs, InP or the like, for example, a liquid encapsulated Czochralski (LEC) method or a horizontal Bridgman (HB) method has been generally applied.

While the LEC method has advantages that crystal orientation is controllable by seeding, a wafer having a large diameter and a circular shape in sectional form can be obtained, and a high purity crystal can be easily obtained by using a liquid encapsulating material ($B_2O_3$), the method has disadvantage that a large temperature gradient in a direction of crystal growth makes thermal stress to the crystal large, so that etch pit density (EPD) in the crystal becomes high. Accordingly, in a case of making an optical device by using the crystal, a problem that a property deteriorates due to a crystal defect is occurred.

On the other hand, while the HB method has an advantage that a crystal having low etch pit density can be obtained due to a small temperature gradient in the direction of crystal growth, the method has disadvantages that making the diameter of wafer large is difficult and further, the only wafer having a shape depending a shape of a crucible (for example, a vault-like shape) can be obtained, because the raw material melt is solidified in the crucible (boat).

As a method for producing a single crystal, which complements the respective disadvantages of the HB method and the LEC method and has the respective advantages thereof, the vertical gradient freeze (VGF) method and the vertical Bridgman (VB) method have been developed.

With the VGF method and the VB method, a temperature of a crystal growth furnace is lowered to gradually cool compound semiconductor raw material melt contained in a refractory crucible, thereby the compound semiconductor single crystal is grown. Therefore, these methods have advantages that the thermal stress is small and the etch pit density is small, because the temperature gradient in the melt during the crystal growth is tens to several ° C./cm, which is one digit smaller than the LEC method.

Figure 8:
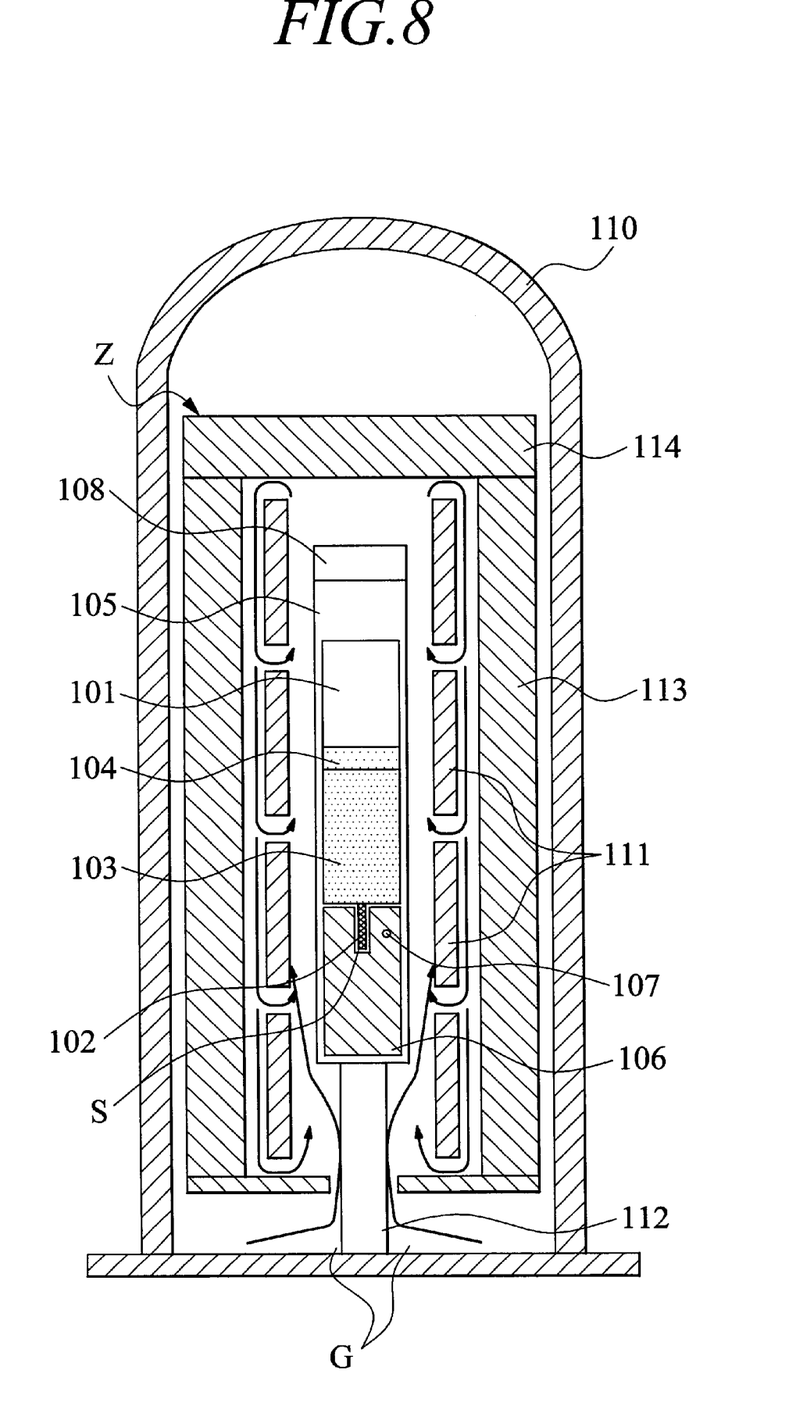
FIG. 8 is a sectional view of a crystal growth apparatus used for the prior VGF method.
Figure 9:
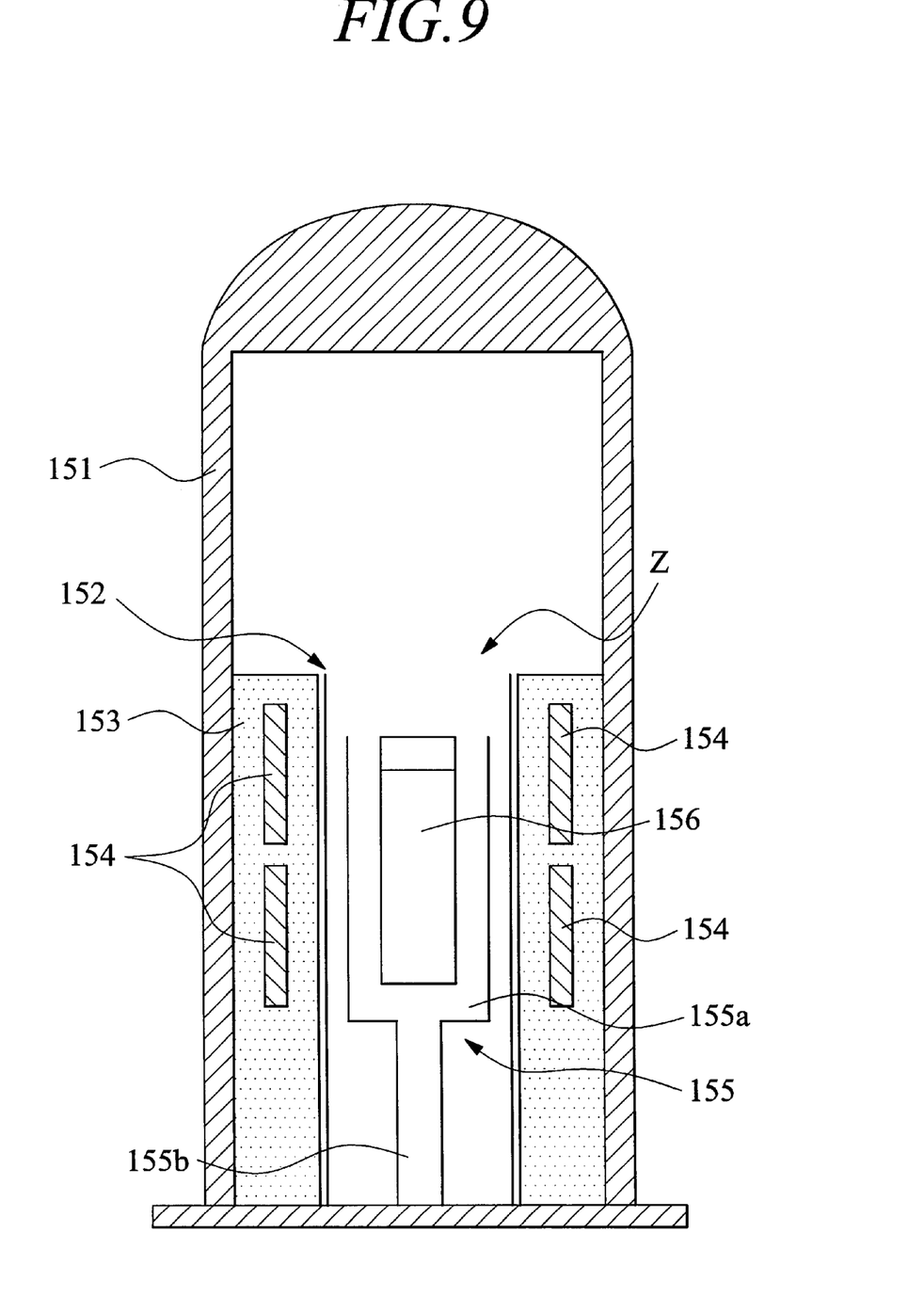
FIG. 9 is a schematically sectional view of a lower portion of another crystal growth apparatus.

In a case of the VGF method, a prior crystal growth apparatus will be explained based on FIGS. 8 and 9. FIG. 8 is a sectional view of a crystal growth apparatus used for the prior VGF method, and FIG. 9 is a schematically sectional view of a lower portion of another crystal growth apparatus.

The crystal growth apparatus shown in FIG. 8 has a hot zone Z surrounded by a cylindrical refractory wall 113 and a top cover 114 in a high pressure container 110. In the hot zone Z, heaters 111, for example, graphite heaters are disposed along inner peripheries thereof. An inner container 105 is set on an inside of the heaters 111 with being supported by a lower shaft 112. A refractory crucible 101, such as a pBN crucible is disposed in an inside of the inner container 105, with being supported by a crucible supporting base 106. A seed crystal set portion 102 having a bottom and a cylindrical shape is formed at a bottom of the crucible 101. The inner container 105 containing the crucible supporting base 106 in the bottom portion and the lower shaft 112 supporting the inner container 105 constitute a crucible supporting means. A thermocouple 107 for measuring a temperature of a seed crystal is provided in the crucible supporting base 106, in the vicinity of the seed crystal set portion. A reference numeral 108 denotes a cover made of quartz and sealing the inner container 105 with fitting.

A seed crystal S is contained in the seed crystal set portion 102. A compound semiconductor raw material 103 and an encapsulating material 104 are contained in the crucible 101.

In the crystal growth apparatus, the compound semiconductor single crystal is grown by heating the hot zone Z, melting the compound semiconductor raw material 103 in the crucible 101 to be raw material melt, and by gradually cooling the raw material melt of the compound semiconductor so that a single crystal will grow upward from a lower portion of the crucible 101.

On the other hand, with the crystal growth apparatus shown in FIG. 9, a cylindrical refractory wall 153 is set in a high pressure container 151 and heaters 154 are buried in the cylindrical refractory wall 153. In an inside of the cylindrical refractory wall 153, a furnace tube 152 is provided, and in an interior thereof, a crucible 156 is fixed and supported by a susceptor 155 as a crucible supporting means. The susceptor 155 has a crucible supporting portion 155a and a lower shaft portion 155b. In this example, the interior of the furnace tube 152 constitutes a hot zone Z. In the crystal growth apparatus, the susceptor 155 is heated by the heaters 154, and the crucible 156 is heated by the heated susceptor 155 to melt the compound semiconductor raw material in the crucible to be the raw material melt. Then, the raw material melt of the compound semiconductor is gradually cooled so that the single crystal will grow upward from a lower portion of the crucible 156, thereby the compound semiconductor single crystal is grown.

According to the VGF method and the VB method, the wafer having the circular shape can be obtained by using the crucible having the bottom and the cylindrical shape. Further, the compound semiconductor raw material melt contained in the crucible is gradually cooled to grow the compound semiconductor single crystal, with lowering the temperature of the crystal growth furnace, thereby the temperature gradient in the direction of the crystal growth becomes small, so that making the etch pit density of the grown crystal low can be easily achieved.

However, the VGF method and the VB method are easy influenced by a slight change of the temperature in the reaction furnace, by an unevenness on an inner wall of the crucible or by contaminants attached to the inner wall. Thus, crystal defect portion, such as a twin or polycrystal is generated in a crystal diameter increasing portion which is from an initial point of the crystal growth in the crucible to a body portion thereof. These are main causes to lower a yield of the single crystal production.

Among these defects, the polycrystal generation due to the influence of the unevenness of the crucible or the contaminants attached thereto comes to be prevented by using the liquid encapsulating material ($B_2O_3$) during the crystal growth. On the other hand, the slight change of the temperature in the furnace comes to be solved by recent progresses of the temperature control technology. However, a method for effectively preventing the twin generation in the crystal diameter increasing portion from the initial point of the crystal growth to the body portion has not been developed.

In a case of growing a compound semiconductor single crystal of zinc-blende structure, such as GaAs or InP by using a seed crystal, it has shown that there is a closely relation between a tilt angle of the diameter increasing portion from the seed crystal to the body portion and probability of generation of the twin.

That is, in a case of growing a (100)-oriented crystal, a (111) facet plane appears in the diameter increasing portion and the twin generates from the facet plane. This phenomenon is verified by the experiments carried out by the present inventors. According to the experiments by the presest inventors, all twins generate along the facet plane of the crystal in which the twins generate.

An angle between the (111) facet plane and (100) orientation is 54.7°. Generally, in order to prevent appearance of the (111) facet plane, the tilt angle of the diameter increasing portion of the crucible is made (90°–54.7°), that is, which is smaller than 35.30°.

However, if the tilt angle of the diameter increasing portion is made small, a diameter increasing portion of the grown crystal also becomes long. Therefore, there is a problem that the productivity reduces because a yield of wafer lowers.

There is a report that carrying out of the crystal growth with the tilt angle of 40° to 50°, of the diameter increasing portion of the crucible is efficient (Semiconductor investigation, volume 35, page 4, or the like). However, the present inventors carried out supplementary experiments, thereby it was found that the twin generation was difficult to be sufficiently suppressed when the tilt angle of the diameter increasing portion was within 30° to 50°.

The present applicant (Japan Energy Corp.) proposed a method for producing a single crystal, wherein a crucible of which a bottom tilts to make a determined angle of not less than 80° and less than 90° to a vertical direction so as to gradually lower toward the center of the bottom is used to suppress the twin generation in a case of producing a compound semiconductor single crystal with the VGF method or the VB method (Japanese Patent Application No. Hei 9-119069).

With the producing method, the bottom of the crucible was about flat, thereby it became a state that there was substantially little diameter increasing portion from the seed crystal to the body portion. Then, time of the crystal growth on the diameter increasing portion where the twin tended to generate became extremely short, so that the drastic decrease of the provability of the twin generation was expected.

However, with respect to InP, the twin tends to generate physically compared with GaAs, thereby it was difficult to sufficiently suppress the twin generation in the diameter increasing portion by the producing method when the crystal growth was carried out with the VGF method or the VB method. Therefore, with respect to the production of the InP single crystal, a method has proposed, in which a seed crystal having approximately the same diameter as that of the growing crystal with the VGF method or the VB method is used for making physically no diameter increasing portion from the seed crystal to the body portion so as not to generate the twin.

However, with the above-described method, the seed crystal having approximately the same diameter as that of the growing crystal is required, thereby there is a problem that a wasteful seed crystal portion is large, which causes to increase a production cost, so that it is not practical for the industrial production.

Further, when the growth of the compound semiconductor single crystal is carried out in a high pressure container with the VGF method or the VB method, with introducing high pressure inert gas thereinto, there is a problem that the crystal defect portion, such as a twin or polycrystal generates in the seed portion or in a portion extending from the seed portion to the body portion, which is one of factors lowering the yield of the single crystal production.

With respect to this problem, it is caused by a temperature fluctuation during the growth in the apparatus, which is found by studies by the present inventors.

That is, in the FIG. 8, the arrows G show a gas flow in the high pressure container, simulated by a computer. As shown in the figure, it was ascertained that the gas flow of different directions collided at approximately the same speed, thereby the gas flow tended to disturb, which was a cause to occur the temperature fluctuation.

The present invention was developed in view of the above-described problems. An object of the present invention is to provide a method for producing a compound semiconductor single crystal, which effectively prevents generation of a twin or polycrystal in a seed portion or a diameter increasing portion extending from the seed portion and can produce a compound semiconductor single crystal with a higher yield, particularly the one, such as InP in which a twin tends to generate.

DISCLOSURE OF THE INVENTION

Hereinafter, the content of consideration and the processes of study until the inventors achieved the present invention will be explained briefly.

At first, the inventors proposed that carrying out of the crystal growth with using a crucible having an about flat-shaped bottom to grow the crystal without forming to the utmost the diameter increasing portion in which the provability of the twin generation is high. With respect to the proposal, the present inventors investigated an optimum condition for the crystal growth in the crystal diameter increasing portion.

Generally, an interface between solid and melt during the crystal growth is prefer that the solid phase is convex-shaped to easily become single crystal. For that purpose, the speed of the crystal growth is desired to be slow to the utmost. However, on the results of experiments carried out by the present inventors, even if the speed of the crystal growth was made slow, the state of the interface between solid and melt in the crystal diameter increasing portion was not so improved, so that it was difficult to effectively suppress the twin generation.

As other manners for improving the interface between solid and melt, the one is proposed that a holding material for the crucible is properly changed, the seed crystal portion is forced to be cooled or the like. However, according to the experiments by the present inventors, none of the manners could not certainly suppress the twin generation.

From the results obtained by the experiments for growing the GaAs single crystal with the VGF method, the present inventors studied and investigated a relation between positions where the twin generated in the crucible and (111) facet patterns shown in the crystal diameter increasing portion to find that the (111) facet patterns related to the twin generation.

That is, among the GaAs single crystals grown with the VGF method, while no twin generated in a case that the facet patterns were nearly a square, the twin generation was often observed in a case that the facet patterns were unsymmetry, such as that only a facet in one direction became long. The generation of these unsymmetrical facet patterns shows that the solidification of the melt in the diameter increasing portion does not proceed in four directions at a uniform rate, but proceeds rapidly in one direction. It is adequately possible that such condition of the facet growth influences the twin generation.

The present inventors, based on the consideration described above, considered that a condition of the crystal growth, by which the facet growth would proceed with good symmetry was required for certainly suppress the twin generation. As a result of many studies, the present inventors have been achieved to obtain a conviction that the speed of the crystal growth, which is faster than a determined value is effective to grow the facet with good symmetry.

Previously, in the VGF method, because the temperature gradient in the vicinity of the interface between solid and melt is small, the rate of the crystal growth of approximately several mm/hr has been desirable although it slightly differs according to the thermal conductivity of the growing crystal.

The present inventors, with respect to InP having a physical property that the twin tends to generate therein, tested the crystal growth with varying the growth rates to 5 mm/hr, 10 mm/hr, 20 mm/hr, or 50 mm/hr at the diameter increasing portion, with being free from the above-described rate of the crystal growth. Although the twin generated in the portion from the seed crystal to the diameter increasing portion at the growth rates of 5 mm/hr, 10 mm/hr, and 20 mm/hr at the diameter increasing portion, it was gradually decreased and it was firstly achieved to obtain the InP single crystal having no twin when the growth rate was 50 mm/hr at the diameter increasing portion.

However, in the case that the growth rate was 20 mm/hr at the diameter increasing portion, the twin generated in a small portion of edge, so that the InP single crystal of high quality could be obtained in most crystal body portion.

Based on the results, the conditions of the growth rate for industrially obtaining the single crystal of InP or the like with a high yield are studied and it comes to conclusion that a desirable rate of the crystal growth at the diameter increasing portion (shoulder portion) is at least not less than 20 mm/hr, preferably not less than 30 mm/hr, more preferably not less than 40 mm/hr, most preferably not less than 50 mm/hr. The present invention is achieved based on the above-described knowledge.

As described above, in one aspect of the present invention, a method for producing a compound semiconductor single crystal comprises the steps of: using a crucible having a bottom, a cylindrical shape, a diameter increasing portion having a reversed conical shape in a lower end side of the crucible, and a set portion for a seed crystal portion in a center of the bottom of the diameter increasing portion; setting a seed crystal in the seed crystal set portion of the crucible; putting a raw material of the compound semiconductor and an encapsulating material into the crucible; enclosing the crucible in an inner container; thereafter setting the inner container in a vertical type furnace; heating the raw material and the encapsulating material by a heating means to melt; and solidifying the obtained raw material melt from the seed crystal toward an upper side with annealing the raw material melt from a lower side to grow a single crystal of the compound semiconductor; wherein a rate of crystal growth at the diameter increasing portion of the crucible is made not less than 20 mm/hr during the crystal is grown.

It may be preferable that the diameter increasing portion having the reversed conical shape, of the crucible has a determined tilt angle of not less than 40° and less than 90° to a normal line of a center of the bottom, more preferably, not less than 60° and less than 90°, and especially, not less than 80° and less than 90°.

A temperature gradient in a direction of the crystal growth at least at the diameter increasing portion of the crucible may be controlled to have 1 to 10° C./cm during the crystal growth.

The vertical type furnace can comprise a high pressure container and a hot zone surrounded by a cylindrical refractory wall and an upper cover, disposed in the high pressure container.

According to the method for producing a compound semiconductor single crystal of the present invention, twin generation in the diameter increasing portion of the crystal can be effectively prevented. Thereby, a compound semiconductor single crystal can be obtained with a high yield, particularly, the compound semiconductor single crystal, like InP in which a twin tends to generate, can be produced efficiently and with a low cost.

In order to solve the problem that the gas of different directions and having approximately the same speed collides, thereby the flow tends to disturb and the temperature fluctuation (a variation between a maximum temperature and a minimum temperature in changes of temperature which rises and falls in the setting temperature in a determined period) becomes large, so that the crystal defect portion, such as a twin, polycrystal or the like tends to generate in the diameter increasing portion of the crystal in the prior apparatus, the present inventors proposed that a laminar flow heading upward from a lower side around the crucible is forced to generate to reduce the influence of a turbulent flow generated by the collision of the gas of different directions. As a result of studies, it came to conclusion that it is optimum that a hole (air hole) is formed in an upper cover for a hot zone to generate convection through the hole in whole inside of the apparatus.

Further, it was found that previously, the bottom of the crucible supporting portion of the crucible supporting means had structure which was flat or nearly flat, thereby, if the crystal growth was carried out in the high pressure container, the gas flow crashing to the bottom was disturbed to become the turbulent flow, which was a cause of a fluctuation of the temperature of a system. It was also found that for preventing this, it was effective that the bottom was formed into a cone-like (cone) shape so that the gas flow around the lower end peripheral surface of the supporting portion would flow along a streamline shape.

In another aspect of the present invention, a method for producing a compound semiconductor single crystal, which has been accomplished based on the above-described knowledge, in which raw material melt of the compound semiconductor contained in a refractory crucible is annealed from a lower side in a hot zone surrounded by a cylindrical refractory wall and an upper cover in a high pressure container to grow the compound semiconductor single crystal, the method comprises the steps of: inducing a gas flow heading upward from a lower side around peripheries of the crucible by a gas flow inducing means; and growing a single crystal of the compound semiconductor, with reducing a temperature fluctuation.

More concretely, the gas flow inducing means can comprise a single or a plurality of air holes (holes) formed in the upper cover for the hot zone, thereby the gas flow heading upward from the lower side around the peripheries of the crucible through the air hole can be induced. Then, the compound semiconductor single crystal can be grown with reducing the temperature fluctuation.

Further, the gas flow inducing means can comprise a single or a plurality of air holes (holes) formed in the upper cover for the hot zone and an opening portion formed in a lower end side of the hot zone, and induce convection which heads upward from the lower side around the peripheries of the crucible, passes through the air holes of the upper cover, heads downward from an upper side around peripheral portions of the cylindrical refractory wall, passes through the opening portion and comes back to the peripheries of the crucible through peripheries of the supporting means. Thereby, the compound semiconductor single crystal can be grown with reducing the temperature fluctuation.

A lower end peripheral surface of the inner container can be formed into a cone-like shape, or the supporting means can comprise a susceptor having a crucible containing portion and a lower shaft, wherein a lower end peripheral surface of the crucible containing portion of the susceptor can be formed into a cone-like shape. Thereby, the gas flow can be changed into a laminar flow, so that the temperature fluctuation can be further reduced. A conical angle of the lower end peripheral surface can be within 20 to 80 degrees.

According to the invention, the temperature fluctuation can be reduced to not more than ±0.05° C., which is approximately 1/10 of that in the prior case, so that generation of crystal defect portion, such as a twin or polycrystal or the like can be suppressed.

PREFERRED EMBODIMENT OF THE INVENTION (First Embodiment)

Figure 1:
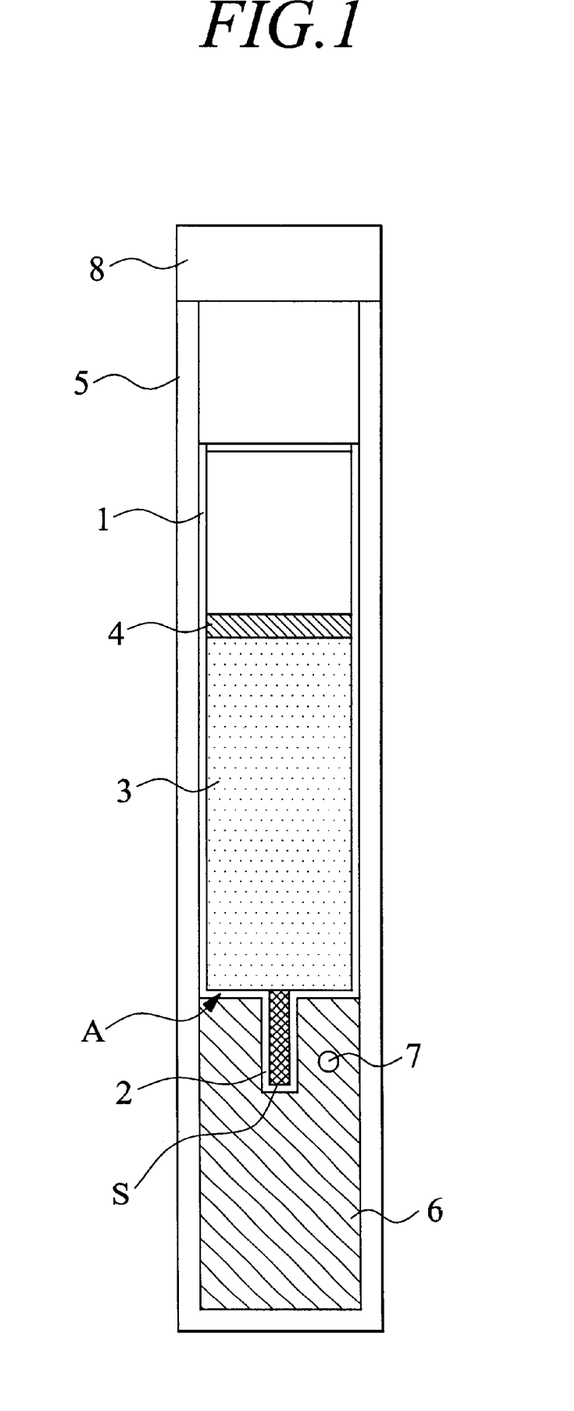
FIG. 1 is a sectional view showing an example of a crucible and peripheral equipment, applied to a method for producing a compound semiconductor single crystal.
Figure 2:
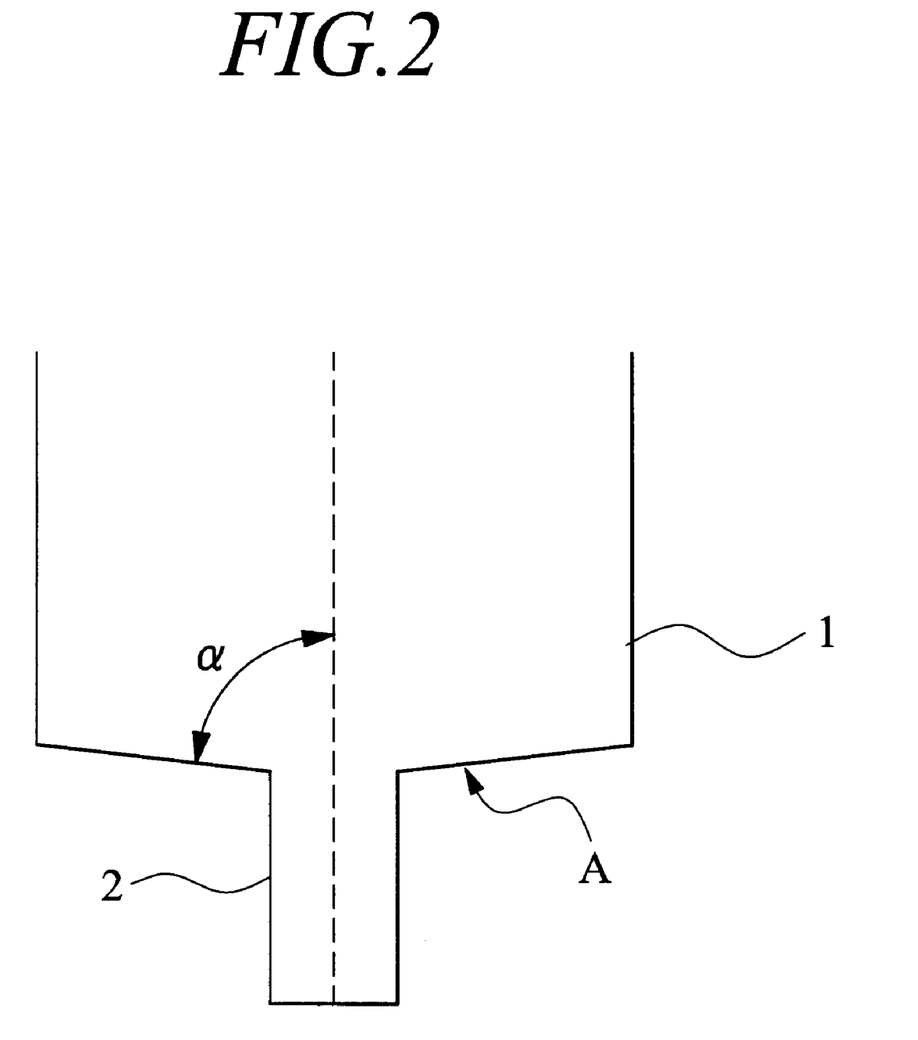
FIG. 2 is an enlarged view of a diameter increasing portion of a crucible.
Figure 3:
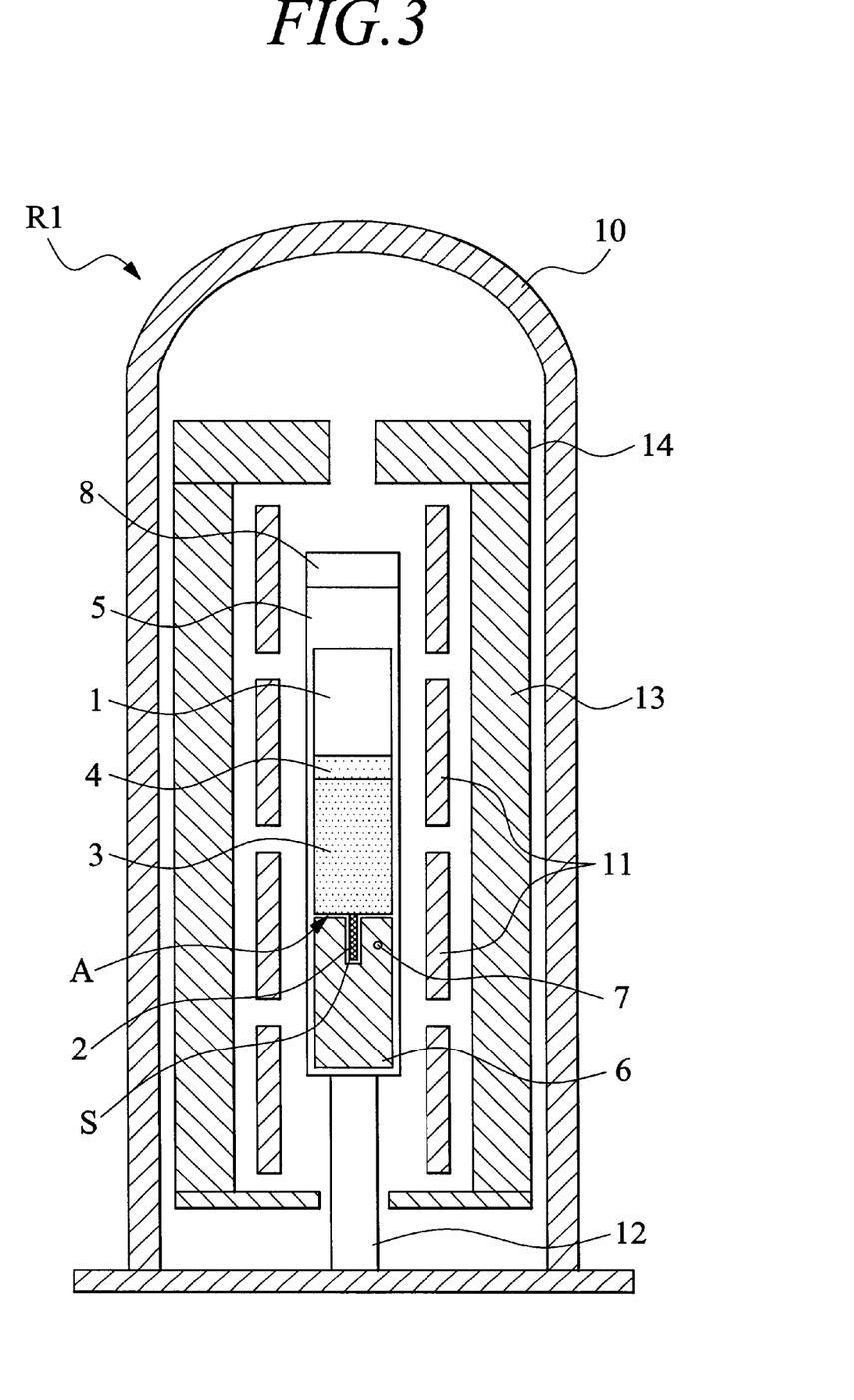
FIG. 3 is a schematically sectional view of a crystal growth apparatus according to the first embodiment.

As an embodiment of the present invention, a case of producing InP single crystal, with applying a method for producing a compound semiconductor single crystal according to the present invention will be explained referring to FIG. 1 to FIG. 3. FIG. 1 is a sectional view showing an example of a crucible and peripheral equipment, applied to a method for growing a compound semiconductor single crystal according to the present invention, FIG. 2 is a schematic view for explanation, showing a diameter increasing portion of a crucible, and FIG. 3 is a schematic view of a crystal growth furnace R1 which is applied when the present invention is applied to the VGF method.

In FIG. 1, a reference numeral 1 denotes a crucible which is made of pBN and refractory. In a bottom thereof, a seed crystal set portion 2 having a bottom and a cylindrical shape is formed.

A diameter increasing portion A corresponding to the bottom of the crucible 1 has a reversed conical shape. The diameter increasing portion A is, as shown in FIG. 2, formed to have a tilt angle of α (α=not less than 40° and less than 90°) to a normal line N of a center of the bottom.

A seed crystal S of InP is put in the seed crystal set portion 2 of the crucible 1 and a polycrystalline raw material 3 of InP and an encapsulating material ($B_2O_3$) 4 are put in a body of the crucible 1. Thereafter, a crucible susceptor (a crucible supporting base) 6 and the crucible 1 in which the raw material 3 is put are set on a lower side of an inner container 5 made of quartz. In the vicinity of the seed crystal set portion 2, a thermocouple 7 for measuring a temperature of the seed crystal is provided in the crucible susceptor 6. Subsequently, a cover 8 made of quartz is fitted in an upper portion of the inner container 5 to seal the inner container 5.

Then, the inner container 5 set as above-described is, as shown in FIG. 3, set at a determined position of a cylindrical multi-stage graphite heater 11 in a high pressure container 10 as a vertical type furnace, with being supported by a lower shaft 12. On an outer side of the heater 11, a hot zone (a cylindrical refractory wall) 13 and a hot zone upper cover 14, constituted of heat insulating material are provided.

After the setting for the inner container 5 in the high pressure container 10 is completed, the heating by the cylindrical multi-stage graphite heater 11 is initiated with applying the determined pressure to melt the polycrystalline raw material 3 of InP and the encapsulating material ($B_2O_3$) 4. In this time, respective outputs of the multi-stage heater 11 are adjusted to maintain a determined temperature gradient so as to gradually become high temperature from the side of the seed crystal S toward upper side of the raw material melt. Then, the raw material melt in the crucible 1 is gradually cooled to a temperature which is not more than a melting temperature from the lower side, so that the single crystal of InP is grown upward.

With respect to the temperature gradient during the cooling, the temperature gradient of 1° C./cm to 10° C./cm is preferable at least at the diameter increasing portion A of the crucible, that is, in a region from an interface of solid and melt between the seed crystal S for an initial point of the crystal growth and the raw material melt to a portion where the growth of body portion of a crystal is initiated. A preferable rate of the crystal growth thereat is not less than 20 mm/hr.

Thereby, the twin generation in the diameter increasing portion of the InP crystal can be effectively suppressed, thereby the InP single crystal can be obtained with a high yield, so that it is possible to reduce the production cost for the InP single crystal.

In the above-described embodiment, the case for growing the InP single crystal with the VGF method is explained, however, it is not limited to this. It is possible to be applied to the VB method and to a case for producing the compound semiconductor, such as GaAs or the like other than InP.

In the above-described embodiment, the case for growing the InP single crystal with the VGF method is explained, however, it is not limited to this. It is possible to be applied to the VB method and to a case for producing the compound semiconductor, such as GaAs or the like other than InP.

EXAMPLE

Hereinafter, more practical example for the first embodiment will be shown, so that the characteristic of the present invention will be clearer.

However, the invention is not at all limited to respective examples.

In this example, a crucible made of pBN and having a diameter of approximately 4 inches and a thickness of 1 mm was used as the crucible 1. The angle α to the normal line N of the center of the bottom of the diameter increasing portion A of the crucible 1 shown in FIG. 2 was made 87°.

At first, the seed crystal S of InP single crystal was put in the seed crystal set portion 2 of the crucible 1. Further, the InP polycrystal 3 of approximately 5 kg as a raw material and the $B_2O_3$ of a suitable quantity as the encapsulating material 4 were put in the crucible 1. Subsequently, the crucible susceptor 6 is put in the lower portion of the inner container 5 made of quartz. The crucible 1 in which the raw material is put as above-described is set on the crucible susceptor 6. Thereafter, the cover 8 made of quartz is fit in the upper portion of the inner container 5 to seal the inner container 5. In the vicinity of the seed crystal set portion 2, the thermocouple 7 for measuring the temperature of the seed crystal is provided in the crucible susceptor 6.

Next, the inner container 5 set as above-described is, as shown in FIG. 3, set at the determined position of the cylindrical multi-stage graphite heater 11 in the high pressure container 10, with being supported by the lower shaft 12.

After the setting for the inner container 5 in the high pressure container 10 was completed, the heating by the cylindrical multi-stage graphite heater 11 was initiated with applying the determined pressure (for example, 45 atm). The crucible 1 was heated so that the temperature of an upper end of the seed crystal S and the raw material 3 would be within 1080° C. to 1062° C. to melt the polycrystalline raw material 3 of InP and the encapsulating material ($B_2O_3$) 4.

In this time, respective outputs of the multi-stage heater 11 are adjusted to maintain the determined temperature gradient so as to gradually become high temperature from the side of the seed crystal S toward upper side of the raw material melt. Then, the raw material melt in the crucible 1 was gradually cooled to the temperature which was not more than the melting temperature from the lower side, so that the single crystal of InP was grown upward.

With respect to the temperature gradient during the cooling, the temperature gradient was made 1° C./cm to 10° C./cm at least at the diameter increasing portion A of the crucible, that is, in the region from the interface of solid and melt between the seed crystal S for the initial point of the crystal growth and the raw material melt to the portion where the growth of the body portion of the crystal was initiated.

The setting temperature in the high pressure container 10 was lowered so that the rate of the crystal growth from the seeded position through the diameter increasing portion A to the 10 mm of body portion would be not less than 50 mm/hr and the growth rate thereafter would be 1 mm/hr, thereby the crystal growth was carried out.

Thereafter, the whole of the inside of the high pressure container 10 was cooled at a cooling rate of 100° C./h. When it was cooled to nearly a room temperature, the grown crystal was taken out of the high pressure container 10.

The obtained grown crystal was the InP single crystal having a diameter of about 4 inches and a full length of about 12 cm. The crystallinity thereof was checked. The generation of the twin or polycrystal was not found at all.

Further, the InP single crystal was cut to check the etch pit density (EPD). The etch pit density at any positions of the crystal was not more than 10000 $cm^{-2}$.

Similarly, as a result of several trying the experiments for the crystal growth, it was possible to obtain the InP single crystal in which no twin is generated in all experiments. It was verified that the method for producing a single crystal according to the present invention was extremely effective to suppress the twin generation.

As described above, according to the method for producing a single crystal of the present invention, the InP single crystal can be obtained with a high yield and it is possible to reduce the production cost of the InP single crystal.

In the above-described example, the case for growing the InP single crystal is explained, however, it is not limited to this. The method can be applied to a case for producing the compound semiconductor, such as CdTe or the like which has physical properties that the twin tends to generate therein and which is difficult to be single crystallized, with the VGF method and the VB method.

(Second Embodiment)

Next, a case of producing InP single crystal, with applying the other method for producing a compound semiconductor single crystal according to the present invention will be explained referring to FIG. 4 to FIG. 7.

Figure 4:
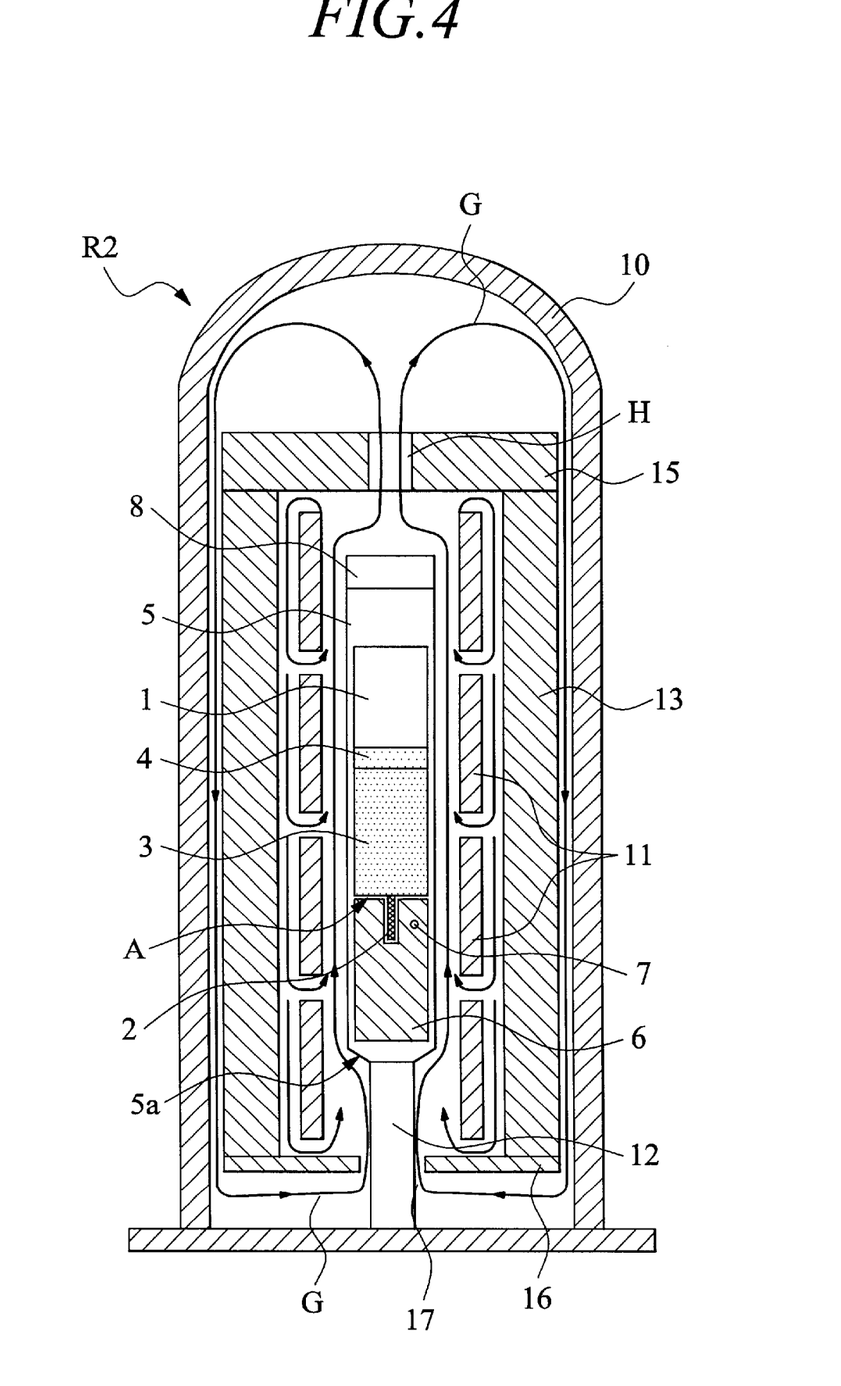
FIG. 4 is a schematically sectional view of a crystal growth apparatus according to the second embodiment.
Figure 5:
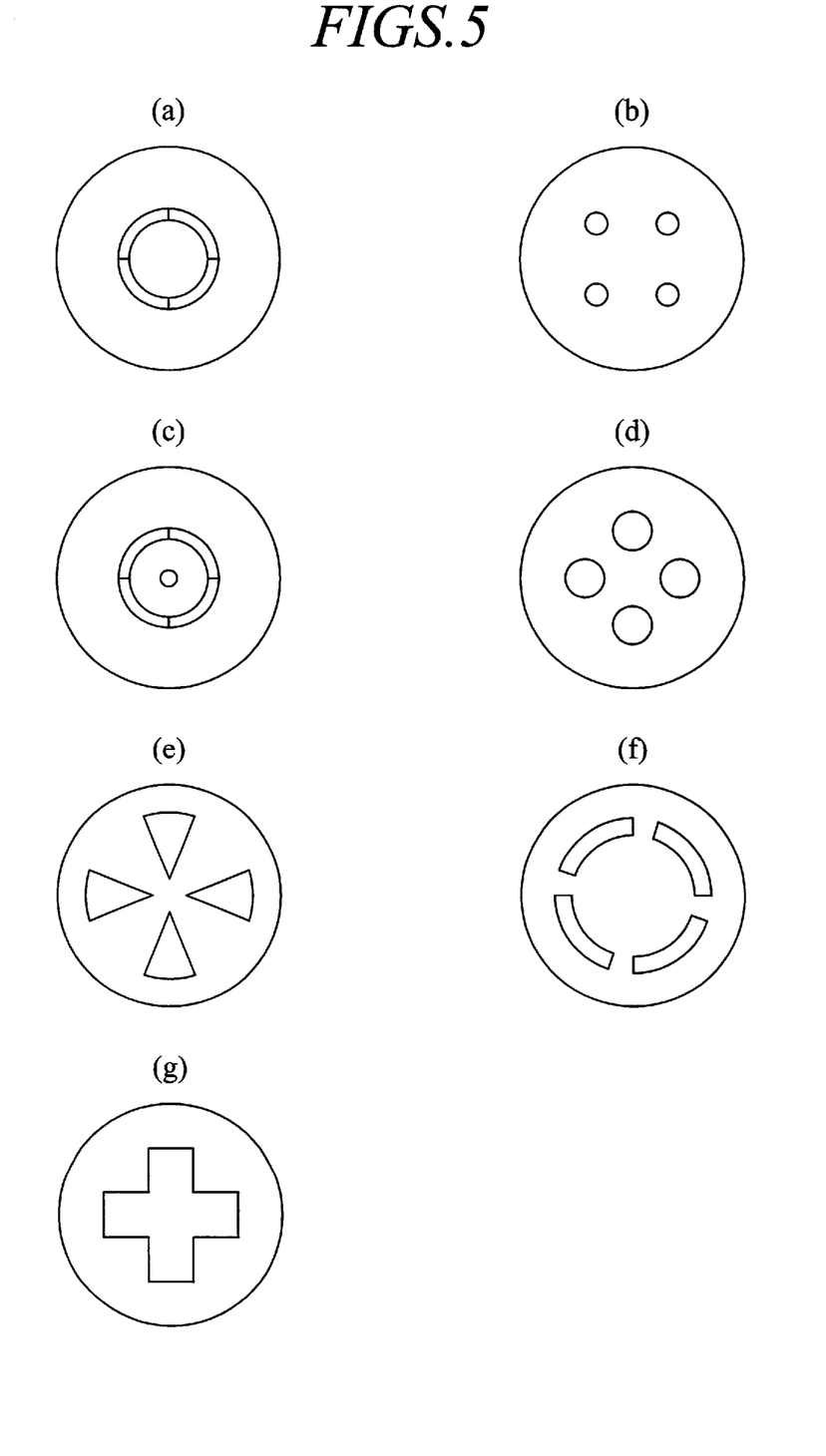
FIG. 5 are top views illustrating various shapes of holes which are usable in the second embodiment.
Figure 6:
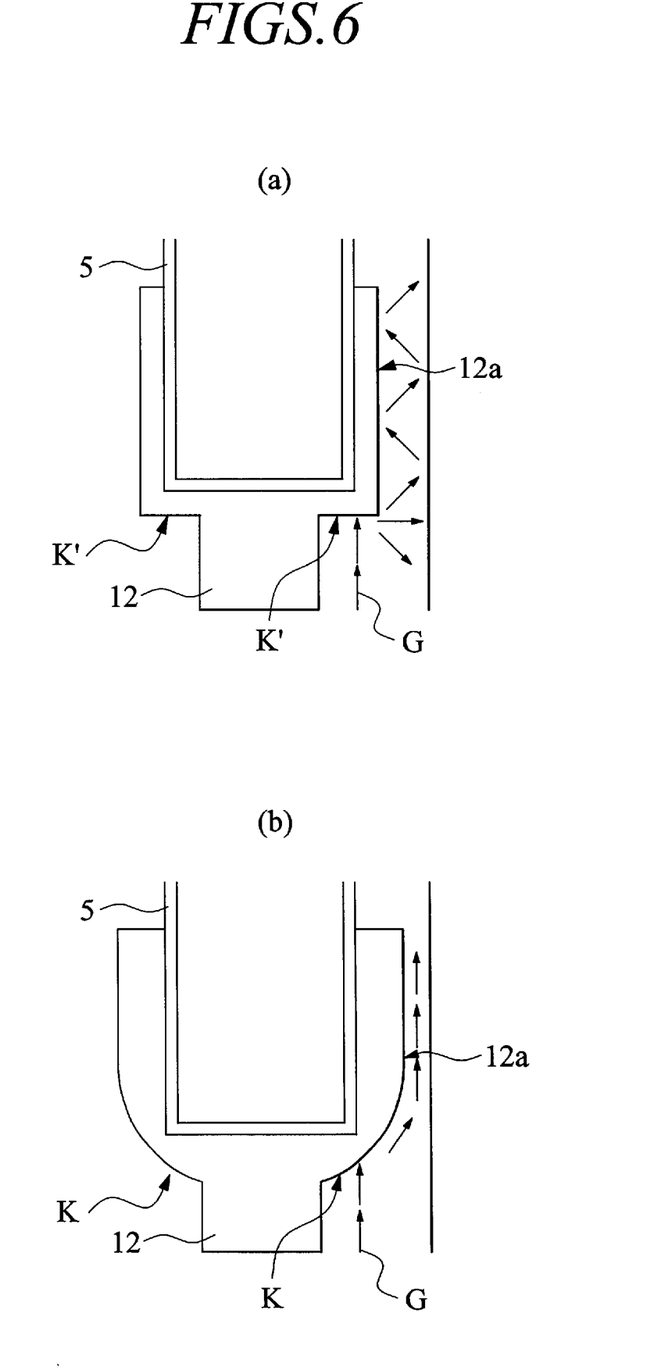
FIGS. 6 are views for explanation, showing states of a gas flow in the second embodiment where a susceptor is formed into a cone-like shape, wherein (a) is before an improvement and (b) is after the improvement.
Figure 7:
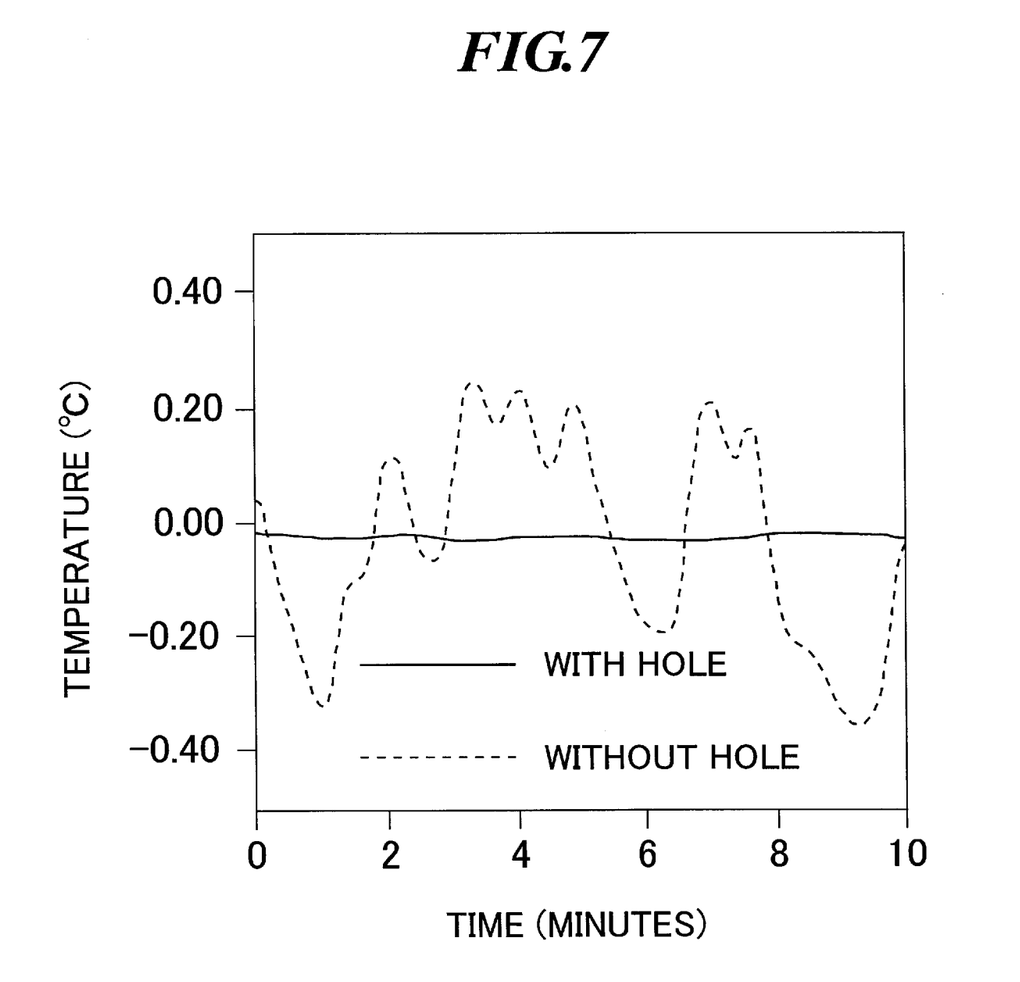
FIG. 7 is a graph showing a comparison result of a temperature fluctuation in the second embodiment and the prior method.

FIG. 4 is a schematically sectional view of a crystal growth apparatus R2 according to the second embodiment, FIG. 5 are top views illustrating various shapes of holes which are usable in the second embodiment, FIG. 6 are views for explanation, for showing states of a gas flow in the second embodiment where a susceptor is formed into a cone-like shape (($a$) is before an improvement and ($b$) is after the improvement), and FIG. 7 is a graph showing a comparison result of a temperature fluctuation in the second embodiment and the prior method.

The crystal growth apparatus R2 shown in FIG. 4 comprises a hot zone (a cylindrical refractory wall) 13 and an upper cover 15 in a high pressure container 10. In the upper cover 15, an air hole (hole) H through which a gas flow G passes is formed.

In the hot zone 13, heater 11, for example, the cylindrical multi-stage graphite heater is set along inner peripheries thereof. In an inside of the heater 11, an inner container 5 is set with being supported by a lower shaft 12. In an inside of the inner container 5, a refractory crucible 1, such as a pBN crucible is disposed with being supported by a crucible supporting base (a crucible susceptor) 6. A seed crystal set portion 2 having a bottom and a cylindrical shape is formed at a bottom of the crucible 1. The inner container 5 containing the crucible supporting base 6 in the bottom and the lower shaft 12 supporting the inner container 5 constitute a crucible supporting means. A thermocouple 7 for measuring a temperature of a seed crystal S is provided in the crucible supporting base 6 in the vicinity of the seed crystal set portion 2. A reference numeral 8 denotes a cover made of quartz, for sealing the inner container 5 with fitting. The seed crystal S is contained in the seed crystal set portion 2. A compound semiconductor raw material 3 and an encapsulating material 4 are contained in the crucible 1.

Further, a space 17 permitting the gas flow G is provided between the lower shaft 12 and an opening portion of a lower cover 16 for hot zone.

For carrying out the crystal growth in the crystal growth apparatus R2 constructed in this way, at first, the seed crystal S of InP is put in the seed crystal set portion 2 of the crucible 1. The polycrystalline raw material 3 of InP and the encapsulating material ($B_2O_3$) 4 are put in the body of the crucible 1. Thereafter, the crucible 1 in which the raw material 3 is put and the crucible supporting base 6 are fitted together and set on the lower side of the inner container 5 made of quartz. Subsequently, the cover 8 made of quartz is fitted in the upper portion of the inner container 5 to seal the inner container 5.

The inner container 5 set as above-described is set at the determined position of the cylindrical multi-stage graphite heater 11 in the high pressure container 10 as the vertical type furnace, with being supported by the lower shaft 12. After the setting for the inner container 5 in the high pressure container 10 is completed, the heating by the heater 11 is initiated with applying the determined pressure to melt the polycrystalline raw material 3 of InP and the encapsulating material 4. In this time, respective outputs of the multi-stage heater 11 are adjusted to maintain a determined temperature gradient so as to gradually become high temperature from the side of the seed crystal S toward upper side of the raw material melt. Then, the raw material melt in the crucible 1 was gradually cooled from the lower side to the temperature which was not more than the melting temperature, so that the single crystal of InP was grown toward the upper side.

According to the embodiment, because the air hole (hole) H is provided in the center portion of the upper cover 15 for the hot zone in the high pressure container 10, the flow around the inner container 5 becomes a laminar flow (arrows G in FIG. 4) heading upward from the lower side. Thereby, a turbulent gas flow is prevented, so that it is possible to suppress the temperature fluctuation.

In a case without a hole H, the gas of different directions and having approximately the same speed collides with each other, thereby the gas flow tends to disturb. Then, the temperature fluctuation becomes large. On the other hand, in a case with the hole H, even if the flow becomes fast, the flow in one direction from the lower side toward the upper side around the inner container 5 is strong. Thereby turbulence of the flow is little, so that it is possible to suppress lower the temperature fluctuation.

Concretely, the gas flow G heads upward from the lower side around the inner container 5, passes through the hole H in the upper cover 15 for hot zone, heads downward from the upper side around peripheral portions of the cylindrical refractory wall, passes through the opening portion (the space 17) of the lower cover 16 for hot zone, and comes back to the peripheries of the inner container 5. That is, such convection is forced to induce, thereby the temperature fluctuation is reduced.

In FIG. 4, the one hole H which is formed in the center portion of the upper cover 15 for the hot zone 13 is shown, however, a mode for providing the hole H is not limited to this. It is possible to form the hole H in any forms and any numbers. The forms of the hole H which can discharge the gas flow with symmetry to the center are preferable. For example, it is possible to take forms of various modes as shown in FIGS. 5(a) to (g).

An open area of the hole is enough if the convection of a laminar flow which heads upward from the lower side around the inner container 5 in the apparatus, passes through the hole H in the upper cover 15, heads downward from the upper side around the peripheral portions of the cylindrical refractory wall 13, passes through the opening portion 17 of the lower cover 16, and comes back to the peripheries of the inner container 5 is induced symmetry. Generally, the one which is 1/10 to 1/3 of a sectional area of the hot zone is enough.

During the single crystal is grown in the high pressure container 10, the temperature fluctuation in the furnace is required to be reduced. The temperature fluctuation is small in the case that the gas flow in the furnace is the laminar flow, while it is large in the case that the gas flow is the turbulent flow, which are already described. As shown in FIG. 6(a), when a lower end peripheral surface K' of the supporting portion (the susceptor) 12a supporting the inner container 5 and being provided on an upper end portion of the lower shaft 12 was flat, it was found that the gas flow from the lower side crashed into the flat surface K' of the lower end portion, thereby the laminar flow became the turbulent flow. The temperature fluctuation can further be reduced by solving this problem.

As shown in FIG. 6(b), the lower end peripheral surface K of the supporting portion (the susceptor) 12a supporting the inner container 5 and being provided on the upper end portion of the lower shaft 12 was formed into a cone-like shape (a reversed conical shape) and the angle was made gradually smaller from 90°. As a result, it was found that the temperature fluctuation becomes much smaller from 80° and that the gas flow which is a turbulent flow is changed into the laminar flow. On the other hand, when the angle was not more than 20°, it was found that the thermal conductivity to the supporting portion (the susceptor) 12a becomes large, thereby it is difficult to obtain the temperature gradient required for the crystal growth. Therefore, within a conical angle of 20° to 80° of the lower end peripheral surface K of the supporting portion (the susceptor) 12a, the temperature fluctuation in the furnace is reduced and the sufficient temperature gradient can be obtained.

In the above-described embodiment, the case for growing the InP single crystal with the VGF method is explained, however, it is not limited to this. It is possible to be applied to the VB method and to a case for producing the compound semiconductor, such as GaAs or the like other than InP.

Hereinafter, more practical examples 1 and 2 of the second embodiment will be shown, so that the characteristic of the present invention will be clearer. However, the invention is not at all limited to the examples.

Example 1

In this example, the InP single crystal was produced by using the crystal growth apparatus R2 for VGF, shown in FIG. 4. The dimensions of the apparatus R2 are approximately as follows.

The high pressure container 10: an inside diameter is 450 mm, and a height is 1200 mm.

The cylindrical refractory wall (the hot zone) 13: an inside diameter is 200 mm, and a height is 1100 mm.

The hole H: a diameter is 30 mm.

The crucible 1: an inside diameter is 104 mm, and a height is 250 mm.

At first, the seed crystal S of InP single crystal was put in the seed crystal set portion 2 of the crucible 1. The InP polycrystal 3 of about 5 Kg as a raw material and the $B_2O_3$ of a suitable quantity as the encapsulating material 4 were put in the crucible 1.

Subsequently, the crucible supporting base 6 is put in the lower portion of the inner container 5 made of quartz. The crucible 1 in which the raw material is put as above-described is set on the crucible supporting base 6. Thereafter the cover 8 made of quartz is fitted in the upper portion of the inner container 5, so that the inner container 5 is sealed.

The inner container 5 set as above-described is, as shown in FIG. 4, set at the determined portion of the cylindrical multi-stage graphite heater 11 in the high pressure container 10, with being supported by the lower shaft 12.

After the setting of the inner container 5 in the high pressure container 10 was completed, the heating by the cylindrical multi-stage graphite heater 11 was started with applying the pressure of 40 normal atmosphere by filling argon gas in the high pressure container 10. The crucible 1 was heated so that the temperature of the upper end of the seed crystal S and the raw material 3 would become approximately 1070° C., thereby the InP polycrystalline raw material 3 and the encapsulating material ($B_2O_3$) 4 were melt.

Then, the temperatures of the heater 11 were adjusted so that the bottom of the crucible would become a melting point of InP (1062° C.), and that the upper portion would have the higher temperature. After the temperature was stably and enough maintained, the temperature of the apparatus was lowered so that the growth rate of the crystal would be about 1 mm/h. After the crystal growth of 150 hours, the crystal was cooled for 30 hours. When the crystal was cooled to nearly a room temperature, the grown crystal was taken out of the high pressure container 10.

The crystallinity of the grown crystal obtained with this example was checked. The generation of the twin or the polycrystal was not found at all.

Similarly, with respect to a case that no hole was provided in the center of the upper cover 15 for the hot zone 13, the crystal growth was carried out. Then, the temperature fluctuation during the crystal growth was compared.

The result of measuring the temperature fluctuation by the thermocouple during the crystal growth is shown in FIG. 7. According to FIG. 7, it is found that the temperature fluctuation is not more than ±0.05° C. in the case that the hole H is provided on the upper portion of the hot zone, which is not more than 1/10 of the temperature fluctuation in the case that no hole is provided.

Thus, the generation of crystal defect portion, such as a twin or polycrystal is effectively prevented by reducing the temperature fluctuation.

Example 2

A heat insulating material made of graphite was placed in the high pressure container in which the gaseous nitrogen of 10 Kg/cm was applied. The crucible made of pBN was used. Further, as shown in FIG. 6(b), the lower end peripheral surface of the supporting portion (the susceptor) supporting the crucible was formed into the cone-like shape (the reversed conical shape). A dummy crystal made of BN was put in the crucible and the temperature was raised. Then, the fluctuation of the thermocouple in a control system or the temperature fluctuation of an inside of the dummy crystal was studied and found that it was not more than ±0.1° C. This value is small compared with the temperature fluctuation of ±0.5° C. in the case that the lower end peripheral surface of the supporting portion (the susceptor) supporting the crucible is flat.

Example 3

In the example 1 according to FIG. 4, the temperature fluctuation can further be made stable and small by forming the bottom of the crucible supporting portion (the bottom 5a of the inner container 5 in the example 1) into the cone-like shape. Accordingly, the single crystal having a better quality can be grown.

In the examples 1 to 3, the growth of the InP single crystal is explained, however, the present invention can be applied to the growth of the compound semiconductor single crystal of the group II-VI or the group III-V, such as GaAs, GaP, CdTe or the like.

Industrial Applicability

The method for producing a compound semiconductor single crystal according to the present invention comprises the steps of: using a crucible having a bottom, a cylindrical shape, a diameter increasing portion having a reversed conical shape in a lower end side of the crucible, and a set portion for a seed crystal in a center of the bottom of the diameter increasing portion; setting a seed crystal in the seed crystal set portion of the crucible; putting a raw material of the compound semiconductor and an encapsulating material into the crucible; enclosing the crucible in an inner container; thereafter setting the inner container in a vertical type furnace; heating the raw material and the encapsulating material by a heating means to melt; and solidifying the obtained raw material melt from the seed crystal toward an upper side with annealing the raw material melt from a lower side to grow a single crystal of the compound semiconductor; wherein a rate of crystal growth at the diameter increasing portion of the crucible is made not less than 20 mm/hr during the crystal is grown. Therefore, the method has advantage that twin generation in a diameter increasing portion of the crystal can be effectively prevented.

According to another invention disclosed in this application, a method for producing a compound semiconductor single crystal, in which raw material melt of the compound semiconductor contained in a refractory crucible is annealed from a lower side in a hot zone surrounded by a cylindrical refractory wall and an upper cover in a high pressure container to grow the compound semiconductor single crystal, the method comprises the steps of: inducing a gas flow heading upward from a lower side around peripheries of the crucible; and growing a single crystal of the compound semiconductor, with reducing a temperature fluctuation. Accordingly, the temperature fluctuation can be not more than ±0.05 which is not more than 1/10 of the one in a case without a hole. As a result, it is possible to solve a situation that crystal defect, such as a twin or polycrystal or the like generates during the crystal growth.

In this way, according to the present invention, a compound semiconductor single crystal can be obtained with a high yield. Particularly, the compound semiconductor single crystal, like InP in which a twin tends to generate, can be produced efficiently and with a low cost.

What is claimed is:

1. A method for producing a compound semiconductor single crystal, comprising the steps of:

using a crucible having a bottom, a cylindrical shape, a diameter increasing portion having a reversed conical shape in a lower end side of the crucible, and a set portion for a seed crystal in a center of the bottom of the diameter increasing portion;

setting a seed crystal in the seed crystal set portion of the crucible;

putting a raw material of the compound semiconductor and an encapsulating material into the crucible;

enclosing the crucible in an inner container; thereafter setting the inner container in a vertical type furnace;

heating the raw material and the encapsulating material by a heating means to melt; and solidifying the obtained raw material melt from the seed crystal toward an upper side with annealing the raw material melt from a lower side to grow a single crystal of the compound semiconductor;

wherein a rate of crystal growth at the diameter increasing portion of the crucible is made not less than 20 mm/hr during the crystal is grown.

2. The method for producing a compound semiconductor single crystal as claimed in claim 1, wherein the diameter increasing portion having the reversed conical shape, of the crucible has a determined tilt angle of not less than 40° and less than 90° to a normal line of a center of the bottom.

3. The method for producing a compound semiconductor single crystal as claimed in claim 1 or 2, wherein a temperature gradient in a direction of the crystal growth at least at the diameter increasing portion of the crucible is controlled to have 1 to 10° C./cm during the crystal growth.

4. The method for producing a compound semiconductor single crystal as claimed in claim 1, wherein the vertical furnace comprises a high pressure container and a hot zone surrounded by a cylindrical refractory wall and an upper cover, disposed in the high pressure container.

5. A method for producing a compound semiconductor single crystal, in which a crucible having a bottom, a cylindrical shape, and a set portion for a seed crystal in a center of the bottom is set in a hot zone surrounded by a cylindrical refractory wall and an upper cover in a high pressure container, with being supported by a supporting means, and raw material melt of the compound semiconductor contained in the crucible is annealed from a lower side to grow the compound semiconductor single crystal, the method comprising the steps of:

inducing a gas flow heading upward from a lower side around peripheries of the crucible by a gas flow inducing means; and growing a single crystal of the compound semiconductor, with reducing a temperature fluctuation of the hot zone.

6. The method for producing a compound semiconductor single crystal as claimed in claim 5, wherein the gas flow inducing means comprises a single or a plurality of air holes formed in the upper cover for the hot zone.

7. The method for producing a compound semiconductor single crystal as claimed in claim 5, wherein the gas flow inducing means comprises a single or a plurality of air holes formed in the upper cover for the hot zone and an opening portion formed in a lower end side of the hot zone, and induces convection which heads upward from the lower side around the peripheries of the crucible, passes through the air holes of the upper cover, heads downward from an upper side around peripheral portions of the cylindrical refractory wall, passes through the opening portion and comes back to the peripheries of the crucible through peripheries of the supporting means.

8. The method for producing a compound semiconductor single crystal as claimed in claim 5, 6 or 7, wherein a lower end peripheral surface of the inner container is formed into a cone shape.

9. The method for producing a compound semiconductor single crystal as claimed in claim 8, wherein a conical angle of the lower end peripheral surface of the inner container or the lower end peripheral surface of the crucible containing portion of the susceptor is within 20 to 80 degrees.

10. The method for producing a compound semiconductor single crystal as claimed in claim 5, 6 or 7, wherein the supporting means comprises a susceptor having a crucible containing portion and a lower shaft, wherein a lower end peripheral surface of the crucible containing portion of the susceptor is formed into a cone shape.

11. The method for producing a compound semiconductor single crystal as claimed in claim 5, wherein the temperature fluctuation is not more than ±0.05° C.

\* \* \* \* \*